United States Patent [19]

Nomiya et al.

[11] 3,934,159
[45] Jan. 20, 1976

[54] SEMICONDUCTOR CIRCUIT DEVICES USING INSULATED GATE-TYPE FIELD EFFECT ELEMENTS HAVING PROTECTIVE DIODES

[75] Inventors: Kosei Nomiya, Tokyo; Toshihiko Kohisa, Sayama; Isao Matsumura, Kodaira, all of Japan

[73] Assignee: Hitachi, Ltd., Japan

[22] Filed: Oct. 18, 1968

[21] Appl. No.: 768,794

[30] Foreign Application Priority Data

| Nov. 13, 1967 | Japan | 42-72629 |
| Nov. 13, 1967 | Japan | 42-72630 |
| Nov. 13, 1967 | Japan | 42-72631 |
| Nov. 15, 1967 | Japan | 42-73055 |
| Nov. 15, 1967 | Japan | 42-73056 |

[52] U.S. Cl. ............ 307/304; 307/238; 307/300; 307/303; 357/41; 317/16; 317/31
[51] Int. Cl.² .................. H03K 3/353; H02H 7/20
[58] Field of Search ......... 317/235, 21.1, 22.2, 16, 317/31; 330/35 FE; 307/205, 238, 279, 304, 300, 303; 357/41

[56] References Cited
UNITED STATES PATENTS
3,408,511  10/1968  Bergersen et al. ............ 307/304

OTHER PUBLICATIONS
Semiconductor Electronics by Sorensen, 1961, p. 11.

*Primary Examiner*—John S. Heyman
*Attorney, Agent, or Firm*—Craig & Antonelli

[57] ABSTRACT

Insulated gate-type field effect transistors used in capacitive memory circuits and having protective diodes for protecting the insulating films below the gate electrodes from electrical breakdown, in which parasitic transistor action which might be caused by minority carriers injected into semiconductor substrates by noise signals applied to the protective diodes are eliminated by means for suppressing the injection of minority carriers or by means for preventing injected minority carriers from reaching the drain regions of the field effect transistors.

20 Claims, 43 Drawing Figures

U.S. Patent    Jan. 20, 1976    Sheet 1 of 9    3,934,159
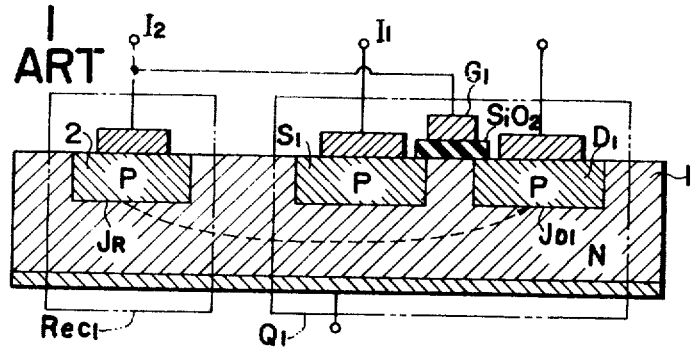
FIG. 1 PRIOR ART
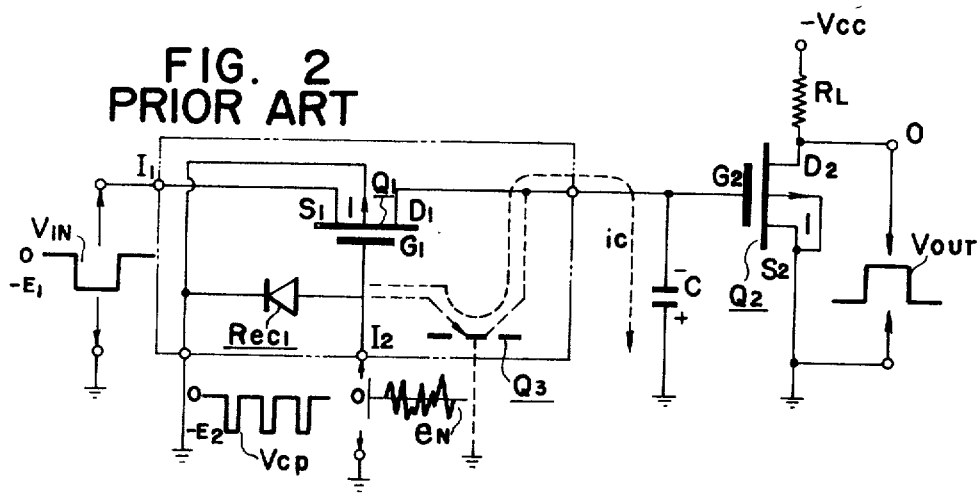
FIG. 2 PRIOR ART
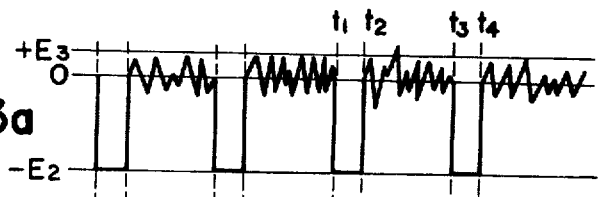
FIG. 3a $V_{CP}$
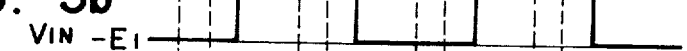
FIG. 3b $V_{IN}$
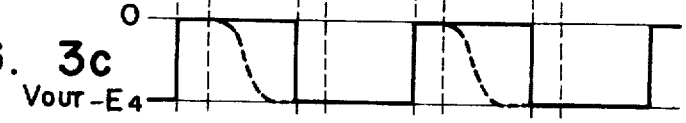
FIG. 3c $V_{OUT}$
INVENTORS
KOSEI NOMIYA
TOSHIHIKO KOHISA
ISAO MATSUMURA
BY Craig & Antonelli
ATTORNEYS

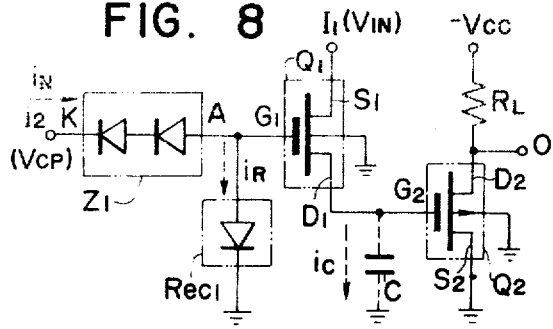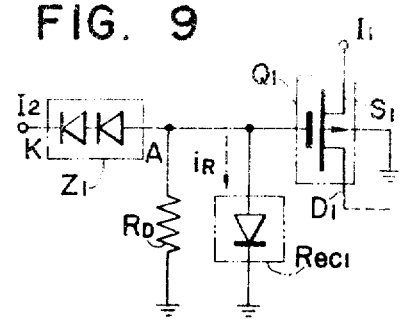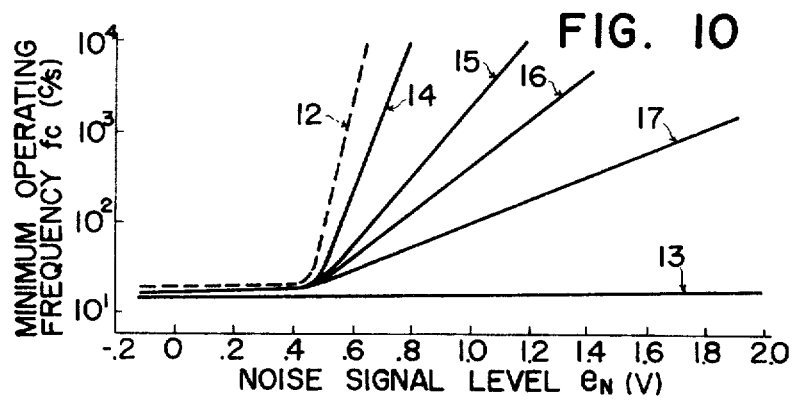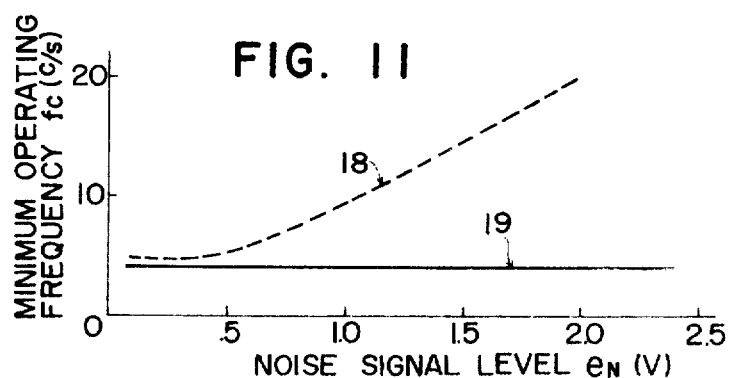

INVENTORS
KOSEI NOMIYA
TOSHIHIKO KOMISO
ISAO MATSUMURA

BY Craig & Antonelli

ATTORNEYS

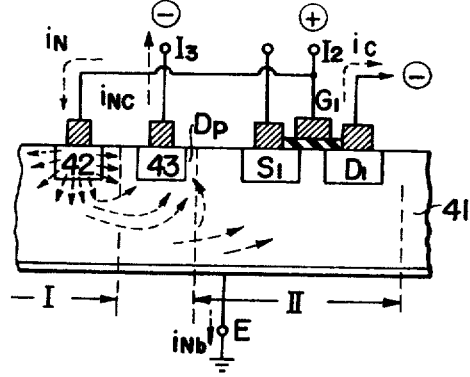
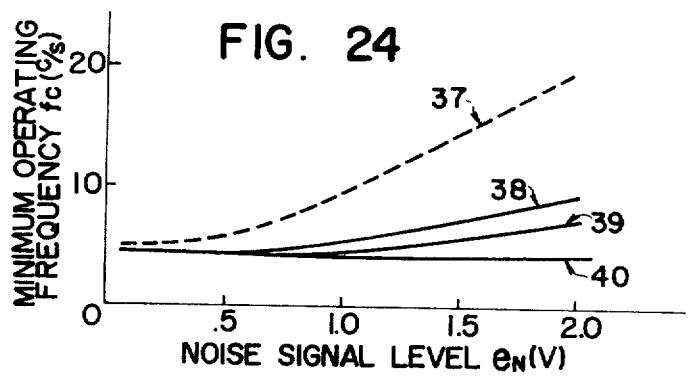
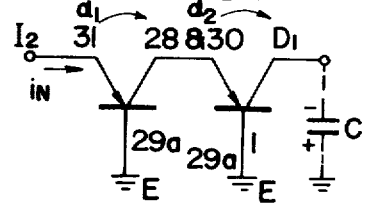
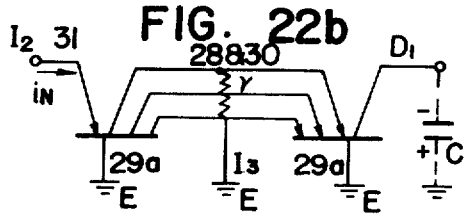
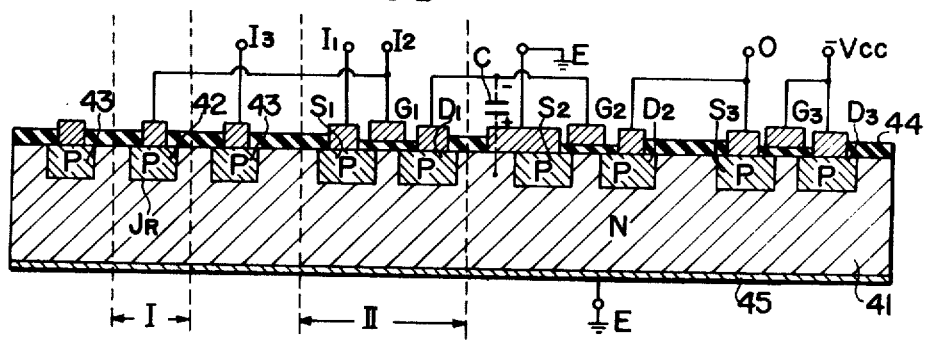

SEMICONDUCTOR CIRCUIT DEVICES USING INSULATED GATE-TYPE FIELD EFFECT ELEMENTS HAVING PROTECTIVE DIODES

BACKGROUND OF THE INVENTION

1. Field of the Invention

The present invention relates to improved semiconductor devices and more particularly to improved integrated devices which include insulated gate-type field effect transistors and protective diodes for protecting the insulating films between the gate electrodes of the field effect transistors and the semiconductor bodies from electrical breakdown.

2. Description of the Prior Art

In general, since the gate G1 of an insulated gate-type field effect transistor Q1 as shown in FIG. 1 has a high capacitive input impedance, a very small amount of electric charge accumulated on the gate G1 induces a high voltage and sometimes causes the insulating film (usually silicon dioxide) between the gate G1 and semiconductor substrate 1 to break down. Therefore, it has been proposed that a protective diode be formed, i.e. a zener diode, integrally in the semiconductor body 1 and that the diode be connected in parallel with the gate G1 as shown in FIG. 1. It has been believed that the protective diode could prevent the insulating film from breakdown without interfering with the characteristics of the field effect transistor.

According to investigation, however, it has been revealed that since the PN junction $J_R$ of the diode is biased in the forward direction by noise pulses $e_N$, a bipolar transistor is formed by the region 2 (as an emitter), the substrate 1 (as a base) and the drain region D1 of the field effect transistor Q1 (as a collector) since the junction $J_{D1}$ is usually biased in the backward direction. Minority carriers injected into the substrate 1 from the diode region 2 diffuse in the substrate 1 and reach the drain region D1, as shown by the broken line arrow in FIG. 1. The emitter common current amplifier factor $\beta$ of this transistor structure is in the order of $10^{-3}$ to $10^{-4}$. This factor of the transistor structure is much smaller than those of usual bipolar transistors (in the order of several tens to several hundreds). Therefore, the parasitic bipolar transistor seems to be of negligible value because of the extremely small current amplifier factor.

When an insulated gate-type field effect transistor having a protective diode is used as a control switch for storing an information signal or an input signal in a memory element having very small capacitance, the parasitic bipolar transistor, according to our study, cannot be neglected even if the current amplifier factor $\beta$ is extremely small as aforementioned. For example, in a semiconductor integrated circuit, such as a dynamic shift register, as shown in FIG. 2, the capacitive memory element C represents the capacitance between the drain D1 of the insulated gate-type field effect transistor Q1 and the semiconductor substrate 1, the capacitance between the gate G2 of the insulated gate-type field effect transistor Q2 and the semiconductor substrate 1, the distributed capacitance existing between the drain D1 of the transistor Q1 and the gate G2 of the transistor Q2, etc. which capacitance is very small, for example, several pF. This capacitor C stores an information signal $V_{IN}$ applied to the input terminal $I_1$. In other words, as shown in FIGS. 3a to 3c when clock pulse $V_{CP}$ is at voltage level $-E_2$, the transistor Q1 turns to its ON-state and the "1" or unit level voltage (i.e. the voltage $-E_1$) of the information signal $V_{IN}$ is stored in the capacitor C. Thereafter, the capacitor C holds the "1" level voltage regardless of the $V_{IN}$ signal until the voltage $-E_2$ of clock pulse $V_{CP}$ is again applied to the transistor Q1 after the zero voltage of $V_{CP}$ once returns the transistor Q1 to its OFF-state.

Since the zero voltage level part of the pulse $V_{CP}$, however, often includes a noise signal $e_N$ which comprises high frequency components of fairly large amplitude, as shown in FIG. 3a, the diode Rec 1 is biased in the forward polarity by the noise signal $e_N$. Only in this instant, a parasitic bipolar transistor Q3 is established, the collector current $i_C$ flows through the transistor Q3 and the capacitor C in spite of the OFF-state of the transistor Q1. Therefore the stored charge in the capacitor C discharges. Especially in such a memory circuit device as that which uses a capacitive memory element of very little capacitance an extremely small amount of collector current $i_C$ of the parasitic transistor Q3 causes the charge stored in the capacitor C to be reduced considerably since the amount of the stored charge is very small, and it results in misoperation of the memory circuit device.

The curves 9, 18, 25, 37 and 47 in FIGS. 7, 11, 19, 24 and 28 show the minimum operating frequency v. noise signal level $e_N$ characteristics of the circuitry (a half bit dynamic shift register) as shown in FIG. 2, in which the minimum operating frequency $f_C$ is the frequency below which the wave form of the output signal $V_{OUT}$ is deformed by noise signals, as shown by broken lines in FIG. 3c, provided that in the relationship as shown in FIGS. 3a to 3c the frequency of the information signal $V_{IN}$ equals one half of the frequency of the clock pulse $V_{CP}$ and the duty cycle of the information signal $V_{IN}$ is 0.5. The lower the minimum operating frequency, the more effective is the memory function of the capacitive element C It can be read from curve 9 in FIG. 7 that when the noise signal level $e_N$ becomes over 0.5 volt the memory function is reduced. The lowering of the memory function causes trouble especially when a dynamic shift register is formed by connecting in series a plurality of unit circuits as shown in FIG. 2. Curves 7, 12, 23, 33 and 45 in FIGS. 6, 10, 18, 23 and 27 show the minimum operating frequency $f_C$ v. noise signal level $e_N$ characteristics of a 16 bit dynamic shift register composed of circuit devices as shown in FIG. 2. It can be seen from curve 7 in FIG. 6 that the minimum operating frequency $f_C$ goes up especially in dynamic shift registers of many bits and the operating frequency in the low frequency region is restricted by noise signals when noise signal levels become over 0.5 volt.

SUMMARY OF THE INVENTION

One of the principal objects of this invention is to provide improved insulated gate-type field effect devices having protective diode elements in which a misoperation based on the parasitic transistors caused by noise signals which bias the PN junctions of the diodes in the forward polarity is eliminated.

Another object is to provide improved devices such as shift registers using insulated gate-type field effect transistors having protective diode elements in which the minimum operating frequency under a large noise signal level is so improved or lowered that driving of the devices by low frequency clock pulses can be done regardless of noise levels.

A further object of this invention is to provide improved integrated circuit devices free from misoperation caused by noise signals.

Other objects and advantages of the invention will be apparent during the course of the following description.

BRIEF DESCRIPTION OF THE DRAWING

FIG. 1 is a cross-sectional view of a field effect device according to the prior art, FIG. 2 is a schematic circuit diagram of an integrated semiconductor device used in a dynamic shift register according to the prior art, FIGS. 3a to 3c are waveform diagrams of clock pulses, input signals and output signals for the dynamic shift register, FIGS. 6, 7, 10, 11, 18, 19, 23, 24, 27 and 28 are graphs showing minimum operating frequency v. noise signal level curves for the circuit devices according to the invention, FIGS. 8, 9, 12 and 13 are schematic circuit diagrams of another embodiment and its variations according to the invention, FIGS. 22a and 22b are equivalent circuit diagrams for the integrated semiconductor circuit shown in FIG. 21a, FIGS. 25a, 26a and 26b are cross-sectional views of a further embodiment and its variations according to the invention, and FIG. 25b is a cross-sectional view of a part of the integrated circuit shown in FIG. 25a illustrating the operation thereof.

DESCRIPTION OF THE PREFERRED EMBODIMENTS

EXAMPLE 1

This embodiment is characterized mainly in that an auxiliary protective diode is connected in parallel with the protective diode Rec 1 which is formed integrally in a semiconductor body in which the insulated gate-type field effect transistor Q1 is formed and that the auxiliary protective diode is formed in another semiconductor body separated or composed independently from the semiconductor body which includes said transistor Q1 and the diode Rec 1. Therefore, since the protective diode Rec 1 is formed integrally in a common semiconductor substrate with the field effect transistor Q1, the insulating film below the gate electrode is protected by the diode Rec 1 from breakdown thereof until the combination is assembled in a circuit system, and also, after assembling the auxiliary diode into the circuit system, the insulating film below the gate electrode is protected from the breakdown by either the protective diode Rec 1 or the auxiliary diode Rec2. Furthermore, if the protective diode Rec 1 is biased in the forward direction by noise signals the equivalent collector current of the parasitic transistor is considerably reduced since the auxiliary diode Rec2 shunts the noise signal current, and therefore the memory function of the capacitive element C is effectively retained.

Figure 4A:
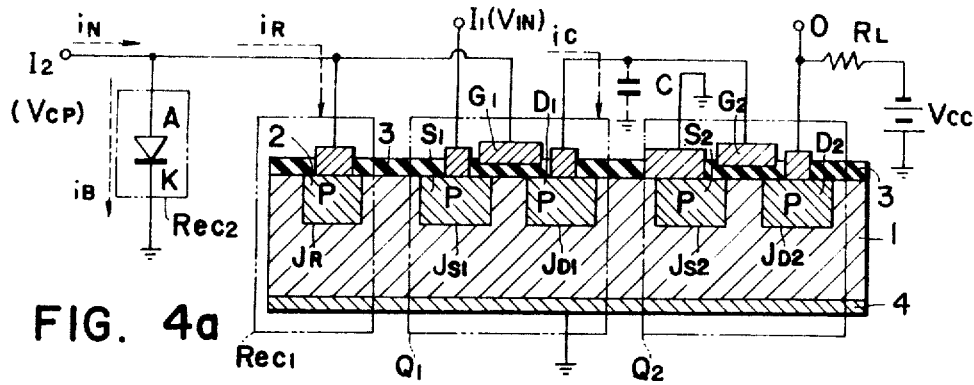
FIG. 4a is a schematic circuit diagram including a cross-sectional view illustrating one embodiment according to the invention.

Referring now to FIG. 4a, transistors Q1 and Q2, and a protective diode Rec 1 are constructed integrally in a semiconductor substrate 1 which may be of any of the semiconductor materials used to prepare transistors in the semiconductor art. For example, the substrate 1 may be a single crystal of N-type silicon of few Ω cm material.

In the manufacture of an integrated circuit device shown in FIG. 4a, a silicon oxide layer 3 of, for example, 6000 A thickness is formed on the surface of the silicon substrate 1 by heating the substrate 1 in an oxidizing atmosphere. By means of a photo-resist and acid etching, or other suitable technique, the silicon oxide 3 is removed to make holes which correspond to the surface portions at which a drain D2 and a source S2 of the transistor Q2, a drain D1 and a source S1 of the transistor Q1, and one region 2 of the diode Rec 1 are to be formed, respectively. The silicon oxide layer 3 is left intact over the other surface areas of the substrate 1.

By a common diffusing method an impurity determining the P conductivity type, for example, boron is then introduced into the semiconductor substrate 1 though the holes in the silicon oxide layer 3 to prepare the p-type regions 2, S1, D1, S2 and D2. PN junctions $J_R$, $J_{S1}$, $J_{D1}$, $J_{S2}$ and $J_{D2}$ are also formed between P-type regions 2, S1, D1, S2 and D2 and the N-type common substrate 1, respectively. Since the diffusion of impurities are usually performed in an oxidizing atmosphere, the surface of the substrate 1 in the holes is again covered with silicon oxide during the diffusion.

By means of another photo-resist and acid etching or the like step, the silicon oxide layer 3 is made thin, for example, to a thickness of 1,500 A where gate electrodes G1 and G2 are to be formed, and also the silicon oxide layer 3 is removed to make holes reaching to the regions 2, S1, D1, S2, D2 and the surface part of the substrate 1 in the vicinity of the region S2.

Electrodes are formed for the regions 2, S1, D1, S2, D2, gates G1 and G2, and substrate 1, as shown in FIG. 4, by means of evaporation of metal, for example, aluminum and common photo engraving technique. The region 2 and the gate G1, and also the drain region D1 and the gate G2, may be connected by respective metal layers disposed on the oxide layer 3. And also, as shown in FIG. 4a, an electrode 4 for the substrate 1 and the source region S2 are connected with a common reference potential. The drain region D2 is connected to a source $V_{cc}$ through load resistance $R_L$. The capacitor C includes the capacitance between the drain region D1 and the substrate 1, the capacitance between the gate G2 and the substrate 1, and the distributed capacitance of the wiring between the drain D1 and gate G2.

The diode Rec2 according to the invention is then connected in parallel with and in the same direction as the diode Rec 1. When the conductivity type of the substrate 1 is N-type as shown in FIG. 4a, the anode A of the diode Rec2 is connected with the P-type region 2 and the cathode K of the diode Rec2 is connected with the substrate 1 or the reference potential. Each region in the diode Rec2 is isolated from the semiconductor substrate 1 which includes the transistor Q1 and the diode Rec 1. Namely, carriers which cause the parasitic transistor to act must be prevented from moving from the diode Rec2 to the drain region D1 in the transistor Q1 by certain means, for example, an air gap or dielectric insulating material.

One method of performing the isolation of carriers is to make the diode Rec 1 independently from the semiconductor substrate 1 and to connect the diode Rec 1 electrically with the integrated circuit device including the diode Rec1 and the transistor Q1. Another method is to form the diode Rec2 in a substrate integrally or unitarily with the transistor Q1 and the diode Rec 1 with isolating means, such as a silicon dioxide layer, interposed therebetween.

Figure 5:
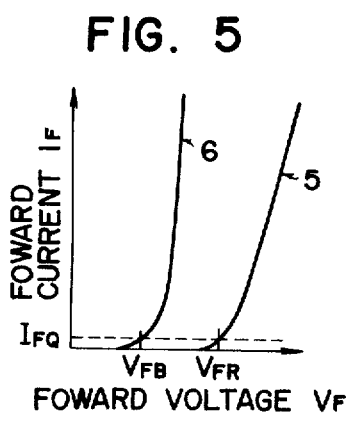

Such a diode, as has a smaller forward voltage for a small current $I_{FQ}$ than that of the diode Rec 1, is chosen as the diode Rec2 as shown in FIG. 5, where the curve 5 is the I—V characteristic for the diode Rec 1 and the curve 6 is the characteristic for the diode Rec2. In this figure current $I_{FQ}$ represents a forward current of the diode Rec 1, above which the parasitic transistor structure composed of the drain region D1 and the region of the diode Rec1 acts effectively as a transistor. The forward voltage $V_{FR}$ is, for example, about 0.5 volt when silicon is used as the material for the semiconductor substrate 1. In general as the diode Rec 2 a germanium diode may be used which has a forward voltage about half as much as that of a silicon diode since a silicon substrate is usually used as the semiconductor substrate 1.

On the other hand the backward breakdown voltage for the diode Rec 2 may be larger than that of the diode Rec1. Where silicon dioxide $SiO_2$ is used as the material for the insulating film 3 below the gate electrode, the breakdown voltage of the diode Rec2 may be several tens of volts, for example, 50 volts or more since the breakdown voltage of the diode Rec 1 is usually determined to a value of several tens of volts, for example, 50 volts which is lower than the breakdown voltage of the insulating film 3 below the gate electrode G1.

Furthermore, it is desirable for the diode Rec 2 to have a steeper rising I–V characteristic in the forward direction than that of the diode Rec. 2.

The operation of the circuit shown in FIG. 4a under the condition of the diode Rec 2 described hereinabove is as follows: Now, assume that such signal voltages $V_{CP}$ and $V_{IN}$ as shown in FIGS. 3a and 3b are applied to the clock pulse input terminal $I_2$ and the information signal input terminal $I_1$, respectively. When a negative clock pulse signal $V_{CP}$ having a peak value of $E_2$, for example, 23V is applied to the terminal $I_2$ during the time between $t_1$ and $t_2$ as shown in FIG. 3a, the voltage $E_2$ is applied to the gate G1 of the transistor Q1 since the diodes Rec 1 and Rec2 have breakdown voltages larger than the pulse signal voltage $E_2$. Since the voltage $E_2$ applied to the gate G1 turns on the channel between the source S1 and the drain D1 of the transistor Q1, the information signal $V_{IN}$ is applied to the capacitive element C and the "1" or unit level $E_1$, for example 12V, of the information signal $V_{IN}$ is stored in the capacitive element C.

The transistor Q1 is then turned off during the time between $t_2$ and $t_3$. During this time undesirable noise signals $e_N$, which includes voltage components of the positive polarity, may be applied to the terminal $I_2$. According to the invention, however, since the noise signal voltage is clamped to a value corresponding to a the current voltage of the diode Rec 2 lower than the forward voltage $V_{FR}$ of the diode Rec 1, the emitter current of the parasitic bipolar transistor is reduced to a value which is substantially negligible and the undesirable noise signal current $i_N$ is shunted through the auxiliary diode Rec 2 as a current $i_B$. Furthermore, since the body of the diode Rec 2 is separated or isolated from the semiconductor substrate 1, the current $i_B$ does not contribute injected emitter carriers for the parasitic bipolar transistor. As a result, the equivalent collector current $i_C$ of the parasitic bipolar transistor, namely the current discharging the charged voltage in the capacitive element C, becomes substantially zero. Accordingly, a discharge of the stored voltage $E_1$ in the capacitor C does not occur during the time from $t_2$ to $t_3$. In other words, the capacitor C retains the voltage $E_1$ constantly during the time from $t_2$ to $t_3$ without being disturbed by noise signals $e_N$.

When the clock pulse signal $v_{CP}$ is again applied to the gate G1 and the transistor Q1 is turned on during the time from $t_3$ to $t_4$, the "0" or zero level voltage (zero volt) of the information signal $V_{IN}$ is then stored in the capacitive element C. As a result thereof the information signal $V_{IN}$ as shown in FIG. 3b which is applied to the input terminal $I_1$ is converted in the output terminal O of the buffer amplifier Q2 to an information signal $V_{OUT}$ as shown in FIG. 3c which synchronizes with the clock pulse signal $V_{CP}$.

Figure 6:
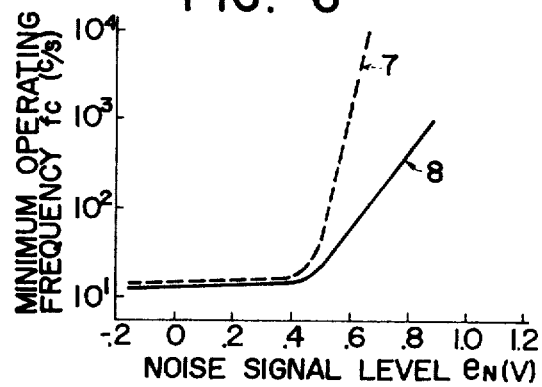
Figure 7:
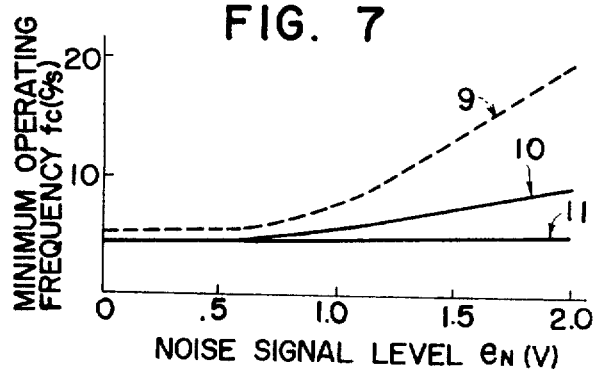

Curves 10 and 11 in FIG. 7 show minimum operating frequency v. noise signal level characteristics for the devices (half bit dynamic shift registers) according to the invention, as shown in FIG. 4a. The curve 10 shows the characteristics in the case where a point contact germanium diode (1N60) is used as the auxiliary diode Rec2, while the curve 11 shows the case where a junction type silicon diode (1S1473) is used as the diode Rec 2. As is apparent from FIG. 7, the minimum operating frequency characteristic of the devices according to the invention is considerably improved, and the characteristics of a 16 bit dynamic shift register according to the invention is also improved, as shown by curve 8 in FIG. 6.

In contrast, the waveform shown by broken lines in FIG. 3c represents a state of improper operation for a device according to the prior art, as shown in FIG. 2, in which the diode Rec2 according to the invention is not connected into the circuit. Namely, when a positive noise signal voltage $e_N$ is applied to the device according to the prior art, a discharge from the capacitive element C by the collector current of the parasitic bipolar transistor results in the improper operation so that $V_{OUT}$ starts to return to the original state $(-E_4)$ from the instant near $t_2$ and the minimum operating frequency characteristic is largely influenced by noise signals, as shown by broken line curve 9 in FIG. 7.

As the auxiliary diode Rec2 according to the invention, a diode having the same forward threshold voltage as the protective diode Rec1, can be used if the diode to be used as the diode Rec2 has a steeper rising I–V characteristic in the forward direction than that of the diode Rec2.

Furthermore, as materials for the insulating film 3, silicon nitride, oxide glasses, aluminum oxide, or silicon oxide deposited from vapor phase can be also used instead of the thermally grown silicon oxide in the embodiment disclosed hereinabove.

Figure 4B:
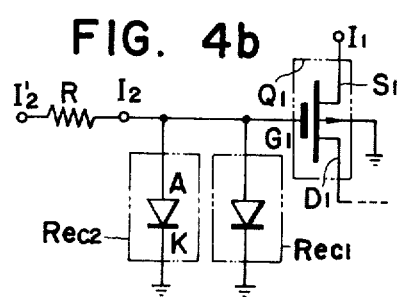
FIG. 4b is a schematic circuit diagram illustrating one variation of the embodiment shown in FIG. 4a, FIG. 5 is a graph showing forward current v. forward voltage curves for diodes usable in the invention.

Considering that the source impedance of noise signal sources is low, an appropriate resistance R of several KΩ may be connected in series with the input terminal I₂ for the clock pulses to make the shunting function by the diode Rec2 effective, as shown in FIG. 4b.

EXAMPLE 2

The gist of this embodiment is to insert an impedance means for dividing the noise signal voltage between the input terminal I₂ and a connecting point to which the gate electrode G1 of the transistor Q1 and one region of the protecting diode Rec 1 are connected, where the transistor Q1 and protecting diode Rec 1 are formed as a unitary device in a semiconductor substrate and the body of the impedance means is isolated from the semiconductor substate. Since, when a voltage including such a noise signal component which biases the PN junction of the diode Rec1 in the forward direction is applied to the input terminal I₂, the noise signal voltage is divided by the impedance means, the forward voltage to be applied to the protective diode Rec 1 is considerably reduced. Accordingly, as injection of carriers to the semiconductor substrate is suppressed and collector current of the parasitic bipolar transistor is also suppressed, the memory function of the capactive element C is effectively retained.

In FIG. 8, the insulated gate-type field effect transistors Q1 and Q2 and the protective diode Rec 1 are formed integrally in a semiconductor substrate in the same manner as described in Example 1 and as shown in FIG. 4a.

The impedance Z1, according to the invention, is connected to a junction point of the gate G1 of the transistor Q1 and one terminal (region 2 shown in FIG. 4a) of the diode Rec1. Although two diodes are shown as the impedance Z1 in FIG. 8, the number of diodes forming the impedance Z1 is not limited to two. Any number of diodes can be used for the impedance Z1 according to circumstances. The diodes forming the impedance Z1 are connected in a polarity opposite to that of the protective diode Rec1. In FIG. 8 since a P type channel field effect transistor is used as the transistor Q1 and the anode (region 2 shown in FIG. 4a) of the diode Rec 1 is connected with the gate G1, the anode A of the diode impedance Z1 is connected with the junction point of the gate G1 and region 2, shown in FIG. 4a, of the diode Rec1, while cathode K of the diode impedance Z1 is connected with the input terminal to the clock pulse $V_{CP}$.

The operation of the circuit device shown in FIG. 8 when signal voltages $V_{CP}$ and $V_{IN}$ as shown in FIGS. 3a and 3b are applied to the input terminals I₂ and I₁, respectively, is as follows: When a clock pulse $V_{CP}$ having normal negative voltage (−E₂) is applied to the input terminal I₂ during the time from t₁ and t₂, the clock pulse voltage (−E₂) is conducted to the gate G1 of control switch transistor Q1 without being impeded by the diodes Z1 since the diodes Z1 are biased in the forward direction. The clock pulse voltage (−E₂) applied to the gate G1 switches the transistor Q1 to its ON-state and information signal $V_{IN}$ (the negative voltage −E₁) is stored in the capacitive element C. When an undesirable positive noise signal $e_N$ is applied to the input terminal I₂ during the time from t₂ to t₃, the diodes Z1 have a high enough impedance to impede the noise signal current $i_N$ since the diode Z1 are biased in the backward direction by the positive noise signal voltage, and a forward current $i_R$ to flow through the diode Rec 1 is suppressed to a substantially negligible value. Therefore, the capacitor element C retains the voltage (−E₂) stored during the time from t₁ to t₂ until the time t₃ without being disturbed by noise signal $e_N$, and a normal wave form shown by the solid line in FIG. 3c can be obtained at the output terminal O of buffer transistor Q2. The wave form shown in broken lines in FIG. 3c represents the state to which the memory function of the conventional circuit devices is lowered.

Curves 13 and 19 in FIGS. 10 and 11 show the minimum operating frequency v. noise signal level characteristics for circuit devices according to the invention (FIG. 10 is for a 16 bit dynamic shift register while FIG. 11 is for a half bit dynamic shift register) in which one diode is used as the impedance Z1. From these curves it will be understood that according to the invention the minimum operating frequency $f_C$ is remarkably reduced and the memory function of the capacitive element C is not disturbed by noise signals. In contrast, curves 12 and 18 represent the conventional circuit device shown in FIG. 2.

In the case where a plurality of diode elements is employed as the impedance Z1 it is desirable to connect in parallel with the protective diode Rec 1 such a resistance $R_D$ as does not interfere with the power loss of the circuit device, as shown in FIG. 9, in order to prevent the gate G1 of the transistor Q1 from being at a floating potential because of the high impedance of the diodes Z1 biased in the backward direction.

Figure 12:
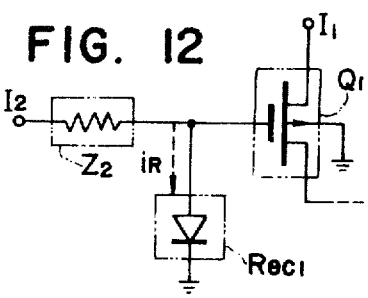

Another variation of this embodiment is shown in FIG. 12, in which a resistive element Z2 is used as the impedance according to the invention instead of the diodes Z1 in FIG. 8. Curves 14, 15, 16 and 17 are for the cases wherein resistances of 10 kΩ, 30 kΩ, 50 kΩ and 100 kΩ are used as the resistive element Z2 respectively. The larger the resistance of the resistive element Z2, the lower becomes the minimum operating frequency under a high noise signal level, and in using resistances over 100 kΩ the minimum the operating frequency is determined practically without considering the noise signal level.

In general since the gate input impedance of the transistor Q1 is high (direct current input resistance is in the order of $10^8 Ω$) when the protective diode Rec 1 is biased in the backward direction, a resistance element having a considerably higher resistive value, for example, several hundred kΩ can be used as the impedance element Z2 without interfering with the supply power of normal clock pulses $V_{CP}$.

Figure 13:
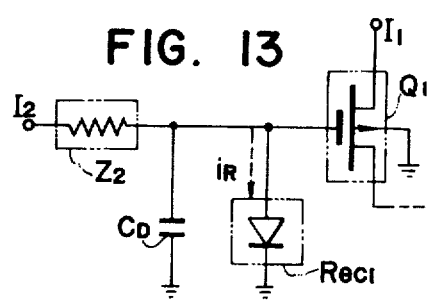

Furthermore, since noise signals are generally composed of high frequency components, a capacitive element $C_D$ may be connected in parallel with the protective diode Rec 1, as shown in FIG. 13, to reduce the impedance to noise signals across both of the terminals of the dioded Rec 1. In this case the divided level of noise signals by the diode Rec 1 can be reduced by using an impedance element Z2 having an impedance of relatively small value.

Figure 14A:
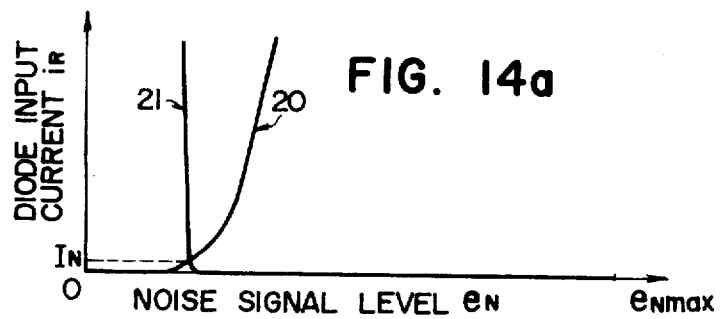
FIGS. 14a and 14b are graphs showing diode input current v. noise signal level curves for the circuit devices as shown in FIGS. 8, 9, 12 and 13, FIGS. 15, 16, 17a and 17b are schematic circuit diagrams of a further embodiment and its variations according to the invention.
Figure 14B:
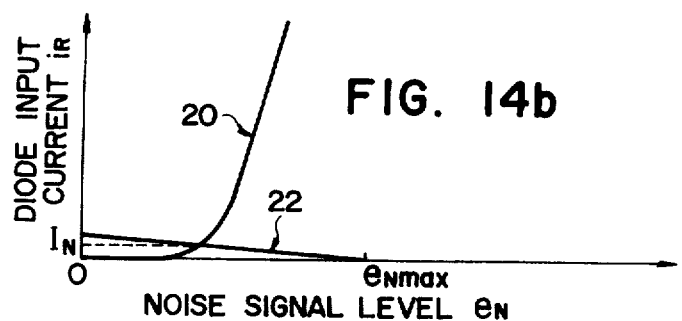

FIG. 14a shows an input forward current $i_R$ v. noise signal level $e_N$ curve for the protective diode Rec 1 when a diode is used as the impedance element Z1, in which curve 20 is the I-V characteristic for the diode Rec 1 while curve 21 is for the use of a diode as the impedance element Z1. FIG. 14b is for the case where a resistance element is used as the impedance element Z2, in which line 22 is the I–V characteristic for the resistance element.

EXAMPLE 3

The gist of this embodiment is that clock pulses are applied to the gate G1 of the insulated gate-type field effect transistor Q1 as a control switch through a uni-directional bias source which is connected in a polarity opposite to the conductive direction of the protective diode Rec 1 in order to convert the voltage level of noise signals having a forward polarity with respect to the diode Rec 1 to a backward polarity and thereby to prevent the parasitic bipolar transistor action. This embodiment is based on the fact that the noise signal level (peak value) in the capacitive memory circuit device is generally below 1 volt, and that threshold voltages of insulated gate-type field effect transistors (the threshold voltages means gate voltages, above which channels of the field effect transistors become conductive) are usually several volts.

Figure 15:
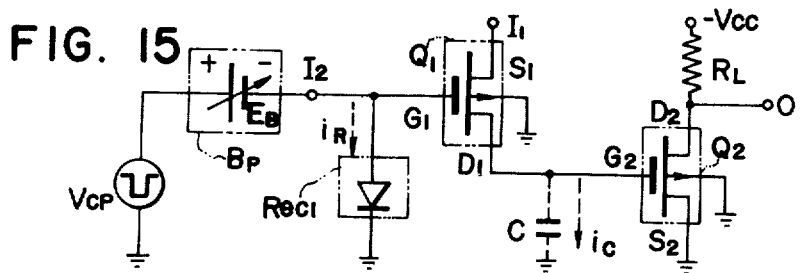

In FIG. 15 the insulated gate-type field effect transistors Q1 and Q2 and the protective diode Rec 1 are formed integrally or unitarily in a simiconductor body 1 and interconnected as shown in FIG. 4a and as described in Example 1. $B_P$ is a uni-directional bias source according to the invention, the polarity of which is such as to bias the protective diode Rec 1 in the backward direction, and the voltage of which has a voltage value lower than the threshold voltage Eth, for example, 7 volts of the transistor Q1.

Figure 20A:
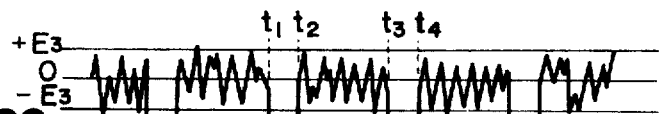
FIGS. 20a to 20d are waveform diagrams of clock pulses, input signals and output signals for the circuit devices shown in FIGS. 15, 16 and 17, FIGS. 21a to 21e are cross-sectional views of a further embodiment and its variations according to the invention.
Figure 20B:
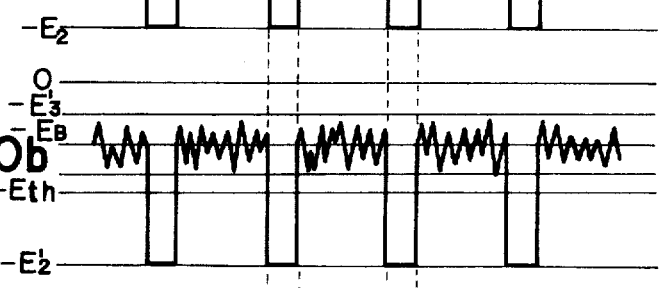
Figure 20C:
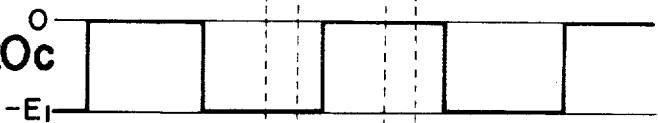
Figure 20D:
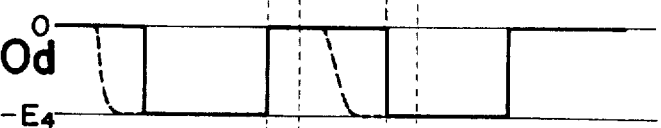

Now, assume that the control pulse signal $V_{CP}$ has a noise signal level $E_3$, for example, 1 volt during the time from $t_2$ to $t_3$ as shown in FIG. 20a. Since the uni-directional bias source $B_p$ has a voltage value $E_B$, the level of the control pulse signal $V_{CP}$ is converted to a level as shown in FIG. 20b. In other words noise signals $e_N$ are shifted by $E_B$ volts in the negative direction relative to the reference potential. Therefore, the protective diode Rec 1 is always biased in the backward direction regardless of noise signals $e_N$ and a parasitic bipolar transistor is no longer formed. Furthermore, as the voltage $E_B$ of the source $B_P$ is below the threshold voltage Eth of the transistor Q1 ($E_B <$ Eth $- E_3$), the OFF-state condition of the transistor is not hampered by the source $B_P$. Accordingly, the voltage ($-E_1$) of the information pulse signal $V_{IN}$ which is stored in the capacitive element C during the time $t_1$ to $t_2$ as shown in FIG. 20c is retained during the time $t_2$ and $t_3$ and a normal waveform as output voltage $V_{OUT}$ is obtained at the output terminal O as shown by a solid line in FIG. 20d. In contrast, the waveform as shown by broken lines in FIG. 20d relates to a conventional memory device, and shows that the device loses its memory function since a parasitic bipolar transistor is established by noise signals $e_N$.

Figure 16:
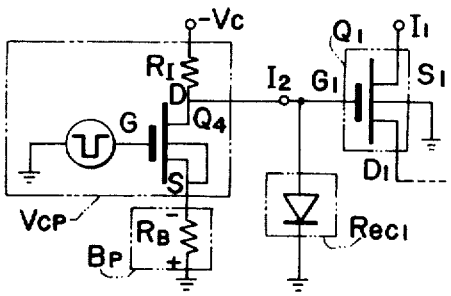
Figure 17A:
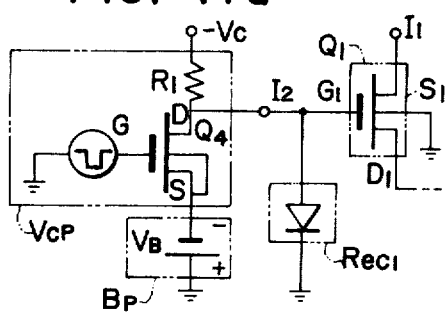
Figure 17B:
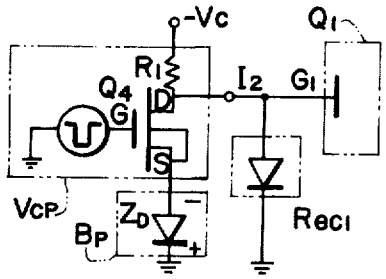

One variation according to this embodiment is shown in FIG. 16. Since control pulse signal sources are generally composed of multivibrators, a control pulse signal source may include an inverter transistor Q4, as shown in FIG. 16. Therefore, a unidirectional bias source according to the invention may be composed of a resistance $R_B$ connected in the output circuit of the inverter transistor Q4. That is, the level of control signal pulses at the terminal $I_2$ is converted as shown in FIG. 20b by making the voltage at the terminal $I_2$ which equals $V_C R_B/R_B+R_I$ lower than the threshold voltage Eth of the transistor Z1 ($V_C R_B/R_B+R_I <$ Eth $- E_3$). A DC bias voltage $V_B$ may be used as shown in FIG. 17a instead of the resistance $R_B$ and a constant voltage element like a zener diode may also be used as shown in FIG. 17b instead of the resistance $R_B$.

Since noise signal level $E_3$ is generally less than 1 volt, the voltage value of at most several volts, for example, 1.5 volts is enough as the voltage $E_B$ of the uni-directional bias source $B_p$, which can be restricted to a value below the threshold voltage Eth of the transistor.

Figure 18:
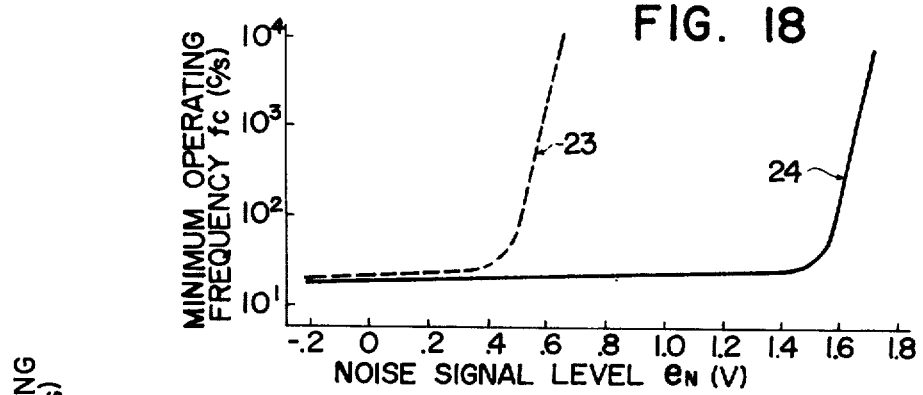
Figure 19:
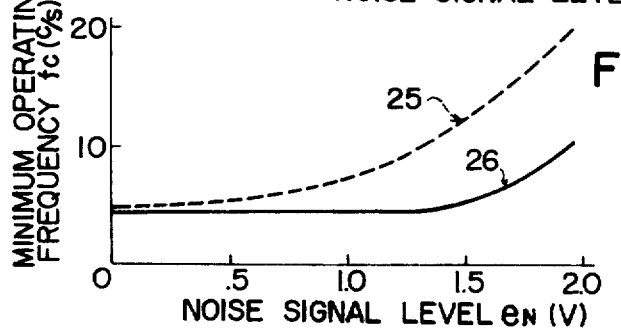

Curves 24 and 26 in FIGS. 18 and 19 are for circuit devices according to the invention, in which the voltage $E_B$ of the unidirectional source $B_p$ is 1.5 volts. In contrast, curves 23 and 25 represent conventional devices. FIG. 18 is for 16 bit dynamic shift registers while FIG. 19 is for half bit dynamic shift registers.

EXAMPLE 4

The gist of this embodiment is to provide an electrical isolation means between a first semiconductor region in which a protective diode Rec 1 is formed and a second semiconductor region in which an insulated gate-type field effect transistor Q1 is formed, and to connect protective diode Rec 1 in parallel with the insulated gate G1 of the transistor Q1 by outer conductive paths of non-semiconductive material. Since, when the PN junction of the diode Rec 1 is biased in the forward direction by a noise signal voltage, a current according to the minority carriers injected into the first semiconductor region in the diode Rec 1 flows as a recombination current through one of the outer conductive paths of non-semiconductor material, transistor actions are suppressed which might be caused by diffusion of injected minority carriers to the drain region D1 of the transistor Q1. Furthermore, since the protective diode Rec 1 is formed in a semiconductor substrate unitarily with the insulated gate type field effect transistor with which the diode is connected by outer conductive paths, the insulating film below the gate G1 is always protected from breakdown throughout the time of manufacture and application (assembling and operation) of the integrated semiconductor device; accordingly, misoperation of the device by noise signals can be prevented without losing the protecting function of the diode Rec 1.

Figure 21A:
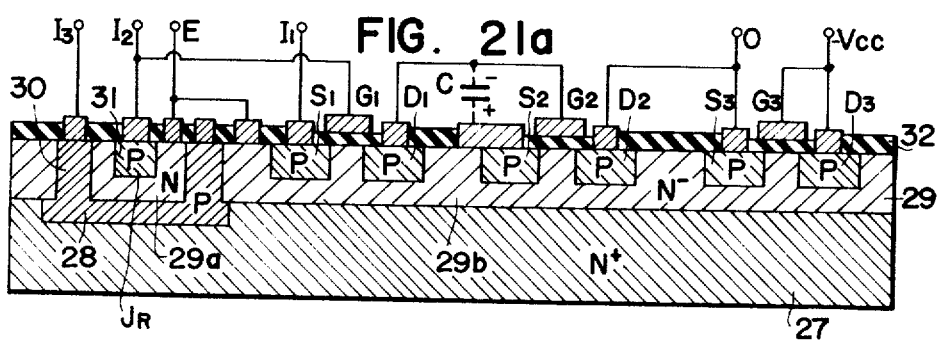

In FIG. 21a P type source and drain regions S1 and D1 and a gate electrode G1 constitute an insulated gate-type field effect transistor corresponding to the transistor Q1 in FIG. 4a, P type source and drain regions S2 and D2 and a gate electrode G2 constitute another insulated gate-type field effect transistor corresponding to the transistor Q2 in FIG. 4a, and P type source and drain regions S3 and D3 and a gate electrode G3, which is connected with the drain region D3, constitute a further insulated gate-type field effect transistor which works as a load resistor corresponding to $R_L$ in FIG. 4a. These transistors Q1, Q2 and the resistor $R_L$ compose a half bit circuit part of a dynamic shift register. A protective diode corresponding to the diode Rec 1 in FIG. 4a which is composed of a P-type region 31 and an N-type region 29a is formed integrally in a semiconductor body with the dynamic shift register but isolated electrically from the insulated gate-type field effect transistor by P-type isolation regions 28 and 30.

In the manufacture of an integrated circuit device shown in FIG. 21a a highly doped semiconductor substrate, for example, an N-type single crystal silicon body 27 having resistivity of about 0.01 ohm cm is first prepared. By means of a common selective diffusion process, a P-type layer 28 is then formed on a plane surface of the substrate 27 and an N-type silicon single crystal layer 29 having resistivity of, for example, 1.5 ohm cm, is epitaxially grown on the plane surface by depositing silicon from vapor phase. On the epitaxial layer 29 a silicon oxide film 32 is formed by heating the combination in an oxidizing atmosphere. By means of a selective diffusion process in which impurities are diffused through holes formed in the oxide film 32, the P-type isolation region 30 which reaches the P-type region 28 and surrounds the N-type region 29a to divide the region 29a from the region 29b as well as the P-type regions 31, S1, D1, S2, D2, S3 and D3 are formed in the epitaxial layer 29 (29a and 29b). Finally electrodes of, for example, aluminum are connected to the regions 29a, 29b, 30, 31, S1, D1, S2, S3 and D3 through holes made in the film 32 while gate electrodes G1, G2 and G3 are disposed on appropriate portions of the film which are made thin to a thickness, for example 1,500 A. These electrodes may be interconnected by conductive layers disposed on the region 29b for the transistors that are electrically connected by an outer conductive path of non-semiconductive material, for example, aluminum which may be disposed on the insulating film 32.

In the operation of the device signal voltage $V_{CP}$ and $V_{IN}$ as shown in FIGS. 3a and 3b, are applied to input terminals $I_2$ and $I_1$, respectively, the terminal E is connected to a reference potential and a power source $V_{CC}$ is connected to the drain $D_3$.

The isolation regions 28 and 30 may be used without connecting the terminal $I_3$ to any part of the device or to any potential, namely they may be provided in a floating state. In this case (referred as a 1st connection), when such noise voltage $e_N$ as biases the PN junction $J_R$ of the protective diode in the forward direction is applied to the region 31, a common base two stage transistor amplifier circuit as shown in FIG. 22a is formed between the region 31 and the drain region D1, and assuming that the current amplifier factor of each amplifying stage is $\alpha_1$ and $\alpha_2$, respectively, and noise signal current is $i_N$, the current flowing into the drain D1 is expressed as $i_N \times \alpha_1 \times \alpha_2$ which is so little that discharge from the capacitor C does not effectively occur during the time from $t_2$ to $t_3$.

The terminal $I_3$ which is connected to the isolation regions 28 and 30 may be connected with the reference potential, namely the potential of the isolation regions 28 and 30 is the same as that of the regions 29a and 29b. In this case (referred as a 2nd connection) since the connecting point of the collector of the 1st stage transistor and the emitter of the second stage transistor in the common base two stage transistor amplifier circuit is connected to the reference potential, only a part of the regions 28 and 30 far from the electrode thereof is a slightly biased by the voltage drop caused by the current $i_N \times \alpha_1$ flowing through the spreading resistance r in the regions 28 and 30 as shown in FIG. 22b, therefore the current flowing into the drain region D1 is further reduced than by the 1st connection.

Furthermore the terminal $I_3$ may be connected with the potential $-V_{CC}$, namely the regions 28 and 30 are biased in the backward direction relative to the regions 29a and 29b. In this case (referred as a 3rd connection) since a parasitic transistor is no longer constructed among the regions 30 (28) – 29b – D1 and the noise signal current $i_N$ flows as the base and collector current for the transistor, respectively, which is composed of the regions 31, 29a and 30 (28), the noise signal current $i_N$ no longer gives any effect to the drain region D1. Accordingly, since even in such a case where the noise signal level $e_N$ is large, the leakage of the charge stored in the capacitive element C is very little, leakage of the stored signal no longer occurs even if the frequency of the clock pulses is very low. In other words, the minimum operating frequency $f_C(c/s)$ under a large noise signal level can be reduced sufficiently.

Figure 23:
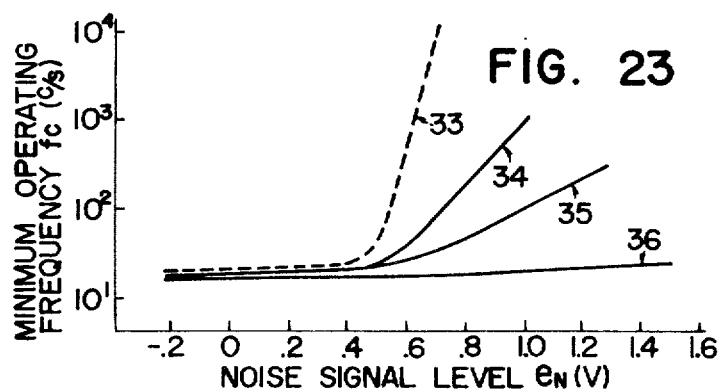

FIGS. 23 and 24 show the minimum operating frequency $f_C$ v. noise signal level $e_N$ curves for 16 bit shift registers and for half bit shift registers, respectively, in which curves 34 and 38, 35 and 39, and 36, and 40 are for the 1st, 2nd and 3rd connections in FIG. 21, respectively. It will be understood from these Figures that the shift registers according to the invention have better characteristics than those according to the prior art, the characteristics of which are shown by curves 33 and 37. Especially in the case of the 3rd connection the minimum operating frequency $f_C$ is constantly low regardless of the noise signal level $e_N$. Furthermore, complicated roundabout paths for interconnections can be avoided by using the regions 28 and 30 as an interconnection path, and this interconnection technique is effective especially when shift registers of from several to several hundred bits are formed unitarily in a semiconductor substrate.

Figure 21B:
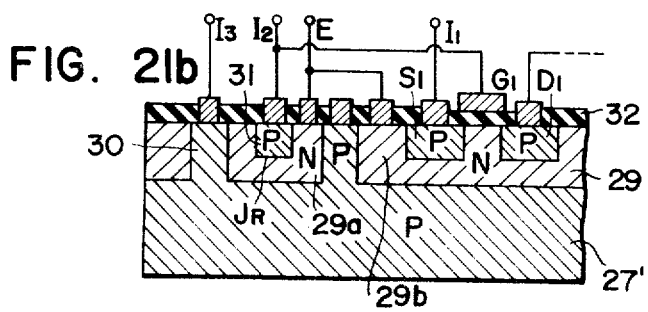
Figure 21C:
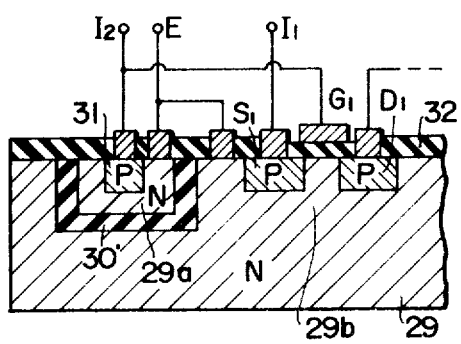
Figure 21D:
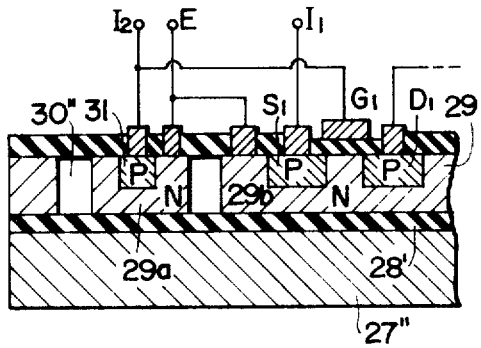
Figure 27:
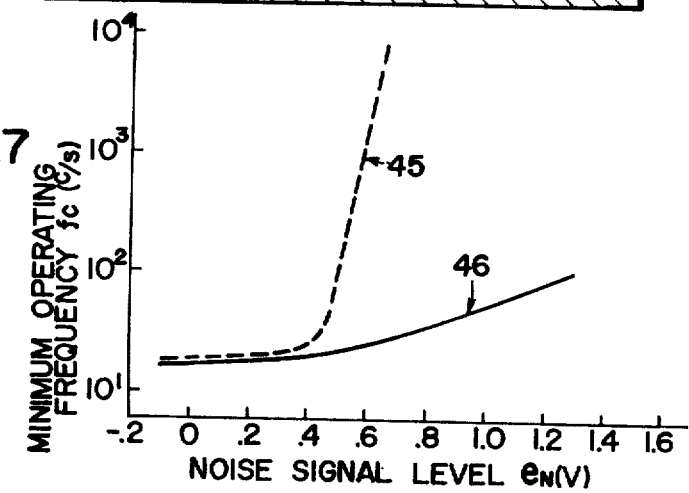

In the embodiment described above a semiconductor substrate 27' the conductivity type of which is opposite to the epitaxial layer 29, for example, a P-type substrate may be used as shown in FIG. 21b instead of the substrate 27. In this case the diffused region 28 is unnecessary. Furthermore, an insulating material layer 30' or an air gap 30'' may be used as an isolation layer between regions 29a and 29b as shown in FIGS. 21c and 21d instead of the regions 28 and 30. In FIG. 21d, 27'' is a silicon policrystalline substrate and 28' is an insulating layer, for example, a silicon oxide layer.

EXAMPLE 5

The gist of this embodiment is to provide an auxiliary region or regions for interrupting or absorbing minority carriers between the drain region D1 and the regions for the protective diode.

Referring to FIG. 25a, P-type regions S1, D1, S2, D2, S3 and D3, an insulating layer 44, electrodes to the each region and gate electrodes G1, G2 and G3 are formed in or on a semiconductor body, for example, N-type silicon substrate 41 and interconnected in the same manner as is described in Example 1 or 4 and shown in FIG. 4a or 21a. The numerals 41, 42, 44 and 45 in FIG. 25a correspond to the numerals 1, 2, 3, and 4 in FIG. 4a, respectively. An annular or ring region 43 according to the invention can be formed at the same time as the P-type regions 42, S1, D1 etc. are formed so as to surround the P-type region 42 in the major surface of the substrate 41. Accordingly, this annular ring region 43 does not require an additional diffusion process.

In the operation of the device shown in FIG. 25a, the region 43 may be used without being connected to any part of the device or to any potential, namely in the floating state. In this case, when such noise signal voltages $e_N$ as bias the PN junction $J_R$ in the forward direction is applied to the junction $J_R$, the minority carriers injected from the junction $J_R$ and diffusing in the surface portion of the substrate 41 are so interrupted or absorbed by the region 43 that the number of minority carriers reaching the drain region D1 is considerably reduced. The minority carriers can be interrupted or absorbed more effectively by connecting the region 43 to the reference potential E, namely by connecting the same to the substrate 41. Furthermore, by biasing the region 43 in the backward direction with respect to the substrate 41 a parasitic transistor will no longer be established among the regions 42-41-D1 since almost all of the minority carriers injected into the substrate 41 from the region 42 are absorbed by the region 43. This operation will be explained more clearly by referring to FIG. 25b.

Most of the minority carriers injected from the region 42 are recombined in the I portion of the substrate 41 and flow to the reference potential E as base current $i_{Nb}$, and the remaining part of the minority carriers which are not recombined diffuse to the II portion of the substrate 41, as indicated in FIG. 25b. However, since a depletion layer $D_p$ extends into the substrate 41 from the region 43 by the backward bias, minority carriers in a broad area are absorbed into the region 43 and flow to the terminal $I_3$ as collector current $i_{Nc}$. Furthermore, a small amount of the remainder of the minority carriers which diffuse to the portion II of the substrate 41 will be also recombined in the substrate 41 during the diffusion thereof and flow to the terminal E as the base current $i_{Nb}$. Accordingly, minority carriers will scarcely reach the drain region D1.

Furthermore, the region 43 may be used as an interconnection path for the power source $V_{cc}$, by which complicated roundabout paths for interconnecton can be aoivded, and it is specially effective in its application to large scale integration circuit devices of from several to several hundred bits.

Figure 26A:
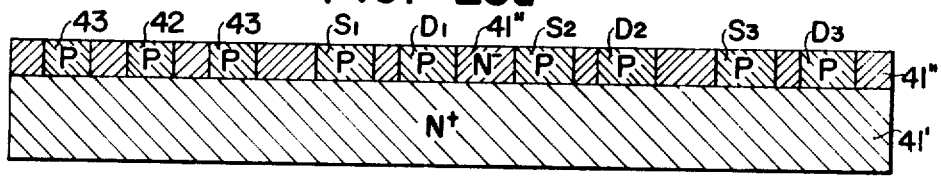

Another variation will be described by referring to FIG. 26a, in which the semiconductor body includes a highly doped substrate 41' of resistivity of, for example, 0.1 ohm cm and a high resistivity epitaxial layer 41'' of resistivity of, for example, 1.5 ohm cm formed on the substrate 41' by the common epitaxial process. The bottom of the annular region 43 reaches the highly doped substrate 41'. Other portions are made in the same manner as the device shown in FIG. 25a. In this structure minority carriers injected from the diode region 42 will be recombined easily in the highly doped substrate 41', and by biasing the region 43 at the reference potential E or at a negative potential relative to the substrate 41' minority carriers will not actually reach the drain region D1. Besides, the highly doped substrate 41' does not change the threshold voltage of the insulated gate-type field effect transistors.

Figure 28:
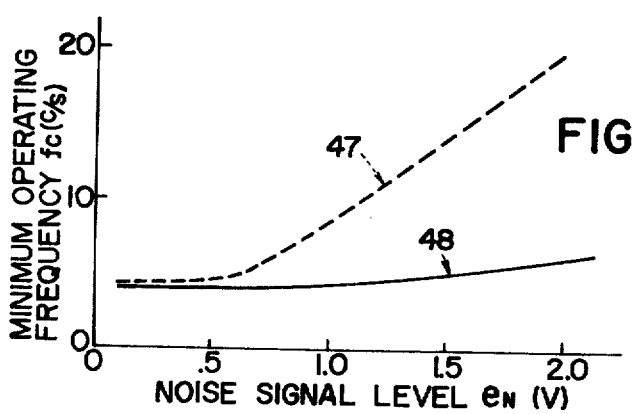

FIGS. 27 and 28 show the minimum operating frequency $f_cv$. noise signal level $e_N$ curves for dynamic shift registers of 16 bits and a half bit, respectively. The curves 46 and 48 are for the device as shown in FIG. 26a in which the region 43 is biased at the potential $-V_{cc}$. On the contrary the curves 45 and 47 are for the conventional devices using circuit units as shown in FIG. 2. It will be understood from the Figures that the dynamic shift registers according to the invention have remarkably improved characteristics in large noise signal level.

Figure 26B:
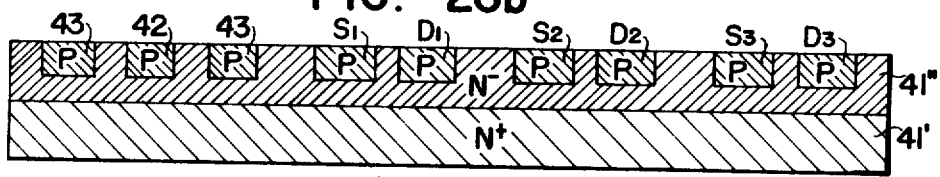

Still another variation will be described by referring to FIG. 26b, in which there is a distance between the substrate 41' and each one of the regions 42, 43, S1, D1, S2, D2, S3 and D3. Other portions are formed in the same manner as the device shown in FIG. 26a. Such a potential that the depletion layer from the region 43 reaches the substrate 41' may be applied to the region 43 in the negative polarity relative to the substrate 41' to prevent minority carriers from diffusing through the layer 41'' between the region 43 and the substrate 41'. The distance between the substrate and each one of the P-type regions may be determined according to the breakdown voltage necessary to the PN junctions between the layer 41'' and each P-type region. For example, the distance may be larger than the distance to which depletion layers extend into the layer 41'' from the drain regions D1, D2 and D3 in operation.

Figure 21E:
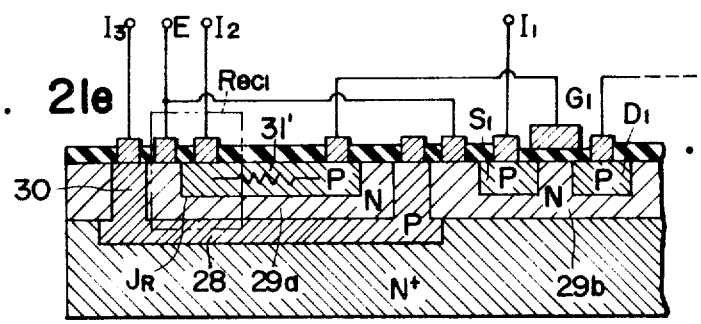

Although various embodiments have been described in connection with insulated gate-type field effect transistors having P-type channels, other types of insulated gate-type devices may be used. For example a P-type semiconductor substrate may be used as the substrate 1 in FIG. 4a. In this case the diffusion regions 2, S1, D1, S2 and D2 are of N-type semiconductor materials. Furthermore, as semiconductor materials for the substrates, germanium or other intermetallic compound semiconductor materials, for example, GaAs may also be used instead of silicon described hereinabove. On the other hand as materials for an insulating film covering the semiconductor substrate silicon nitride, oxide glass, aluminum oxide or silicon oxide deposited from vapor phase may be used instead of the silicon oxide grown thermally on the silicon substrate. Further, the diode region of the diode Rec 1, for example, the region 2 in FIG. 4a may be formed more shallowly than the drain regions D1 and D2 to reduce the breakdown voltage of the protective diode, and also the devices according to the invention can be used with a resistance 31' which is connected between the gate G1 and diode Rec 1 to improve the protection function of the diode, for example, as shown in FIG. 21e and the input $I_2$ is applied to the connection point of the resistance and the diode.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

We claim:

1. In a semiconductor device comprising:
    an insulated gate-type field effect component including a semiconductor substrate of first conductivity type, source and drain regions of second conductivity type opposite to said first conductivity formed in a surface of said semiconductor substrate, and an insulated gate electrode disposed on said surface between said source and drain regions and insulated from said substrate by an insulating film; and
    a protecting semiconductor diode formed integrally in said substrate and connected in parallel between said insulated gate electrode and said semiconductor substrate for protecting the insulating film interposed between said gate electrode and said substrate from breakdown; the improvement comprising
    auxiliary means connected with said semiconductor device for preventing minority carriers from said protecting semiconductor diode from reaching said drain region through said semiconductor substrate when noise signals are applied to the protecting diode.

2. In a semiconductor device comprising:
an insulated gate-type field effect element including a semiconductor substrate of first conductivity type, source and drain regions of second conductivity type opposite to said first conductivity type formed in a surface of said semiconductor substrate, an insulated gate electrode disposed on said surface between said source and drain regions, and an insulating film interposed between said insulated gate electrode and said semiconductor substrate;
a protecting diode means formed in said semiconductor substrate unitarily with said insulated gate-type field effect element for protecting the insulating film below said gate electrode from breakdown, said protecting diode means including a terminal means connected with said semiconductor substrate and a rectifying barrier disposed between said terminal means and said semiconductor substrate; conductive means for connecting said terminal means of said protecting diode means with said insulated gate electrode; and
an input terminal connected with said terminal means of said protecting diode means; the improvement comprising
auxiliary means connected with said semiconductor device for suppressing injection of minority carriers through said rectifying junction of said protecting diode means into said semiconductor substrate when noise signals are applied to said diode means.

3. The semiconductor device of claim 2, further comprising means connected in parallel with said drain region and said semiconductor substrate for producing capacitance in connection therewith.

4. The semiconductor device of claim 2, wherein said auxiliary means comprises an additional diode connected in parallel with said protecting diode means with the same polarity as that of said protecting diode means, the semiconductor body in which said additional diode is formed being electrically isolated from said semiconductor substrate.

5. The semiconductor device of claim 4, wherein the threshold voltage of said additional diode in the forward direction is less than that of said protecting diode means.

6. The semiconductor device of claim 5, wherein the semiconductor material for said semiconductor substrate in which said protecting diode means is formed is silicon, and the semiconductor material for said semiconductor body in which said additional diode is formed is germanium.

7. The semiconductor device of claim 4, wherein the rising slope in the forward current v. voltage curve for said additional diode is steeper than that for said protective diode means.

8. The semiconductor device of claim 4, further comprising a resistance connected with said input terminal in series with said protecting diode means and said conductive means.

9. The semiconductor device of claim 2, wherein said auxiliary means comprises an impedance element connected with said input terminal in series with said protecting diode means and said conductive means.

10. The semiconductor device of claim 9, wherein said impedance element comprises at least one additional semiconductor diode connected in the opposite polarity to said protecting diode means.

11. The semiconductor device of claim 10, further comprising a resistance connected in parallel with said protecting diode means.

12. The semiconductor device of claim 9, wherein said impedance element is a resistance element of 10 $k\Omega$ or more.

13. The semiconductor device of claim 12, wherein the resistance of said resistance element is not less than 100 k $\Omega$.

14. The semiconductor device of claim 12, further comprising a capacitor connected in parallel with said protecting diode means.

15. The semiconductor device of claim 2, wherein said auxiliary means comprises level shifting means having such a polarity as biases said protecting diode means in the backward direction for shifting the level of voltage applied to said input terminal.

16. The semiconductor device of claim 15, wherein said level shifting means comprises a D.C. voltage source connected with said input terminal in series with said protecting diode means and said conductive means.

17. The semiconductor device of claim 15, wherein said level shifting means comprises an inverter transistor having first, second and third terminals; a first resistance connected between said first terminal and a power source; and a second resistance connected between said second terminal and the common reference potential; said first terminal being connected with said input terminal, and said third terminal being adapted for applying an input signal.

18. The semiconductor device of claim 15, wherein said level shifting means comprises an inverter transistor having first, second and third terminals; a load resistance connected between said first terminal and a power source; and a D.C. voltage source connected between said second terminal and the common reference potential; said first terminal being connected with said input terminal and said third terminal being adapted for applying an input signal.

19. The semiconductor device of claim 15, wherein said level shifting means comprises an inverter transistor having first, second and third terminals; a load resistance connected between said first terminal and power source; and a constant voltage element connected between said second terminal and the common reference potential; said first terminal being connected with said input terminal and said third terminal being adapted for applying an input signal.

20. In a memory circuit device comprising;
an insulated gate type field effect transistor including a semiconductor substrate of first conductivity type, a pair of source and drain regions of second conductivity type opposite to said first conductivity type formed in a surface of said substrate and an insulated gate electrode disposed on said surface between said source and drain regions and insulated from the substrate by an insulating film interposed therebetween,
a protective diode formed unitarily with said field effect transistor and having a first region of said second conductivity type and a second region of said first conductivity type contacting with said first region with a PN junction therebetween, the PN junction of the diode having a breakdown voltage lower than the breakdown voltage of said insulating film between said insulated gate electrode and said substrate;

a first conductive means for connecting said first region of the diode with said insulated gate electrode;
a second conductive means for connecting said second region of the diode with said substrate of said first conductivity type; and
a capacitive element connected in parallel between said drain region and a common reference potential; the improvement comprising auxiliary means connected with said memory circuit device for preventing a signal voltage stored in said capacitive element from being discharged by parasitic transistor action between said first region of the diode and said drain region by injection of minority carriers from said first region of the diode to said second region of the diode during the time when said insulated gate type field effect transistor is in nonconductive state.

* * * * *